(12) United States Patent
Muhr et al.

(10) Patent No.: US 10,321,595 B2
(45) Date of Patent: Jun. 11, 2019

(54) BOX-FRAME HOUSING AND A METHOD OF MANUFACTURE

(71) Applicant: Rohde & Schwarz GmbH & Co. KG, Munich (DE)

(72) Inventors: Hermann Muhr, Prackenbach (DE); Andreas Fischl, Geiersthal (DE); Wolfgang Kufer, Muehldorf (DE); Hans-Dieter Koenig, Haar (DE); Helmut Hingrainer, Raubling (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 14/557,032

(22) Filed: Dec. 1, 2014

(65) Prior Publication Data
US 2015/0195939 A1    Jul. 9, 2015

Related U.S. Application Data

(62) Division of application No. 13/817,991, filed as application No. PCT/EP2011/063367 on Aug. 3, 2011, now Pat. No. 9,167,713.

(30) Foreign Application Priority Data

Aug. 23, 2010  (DE) .......................... 10 2010 035 100
Oct. 26, 2010  (DE) .......................... 10 2010 049 605

(51) Int. Cl.
*H05K 5/04* (2006.01)
*B23K 33/00* (2006.01)

(52) U.S. Cl.
CPC .............. *H05K 5/04* (2013.01); *B23K 33/00* (2013.01); *Y10T 29/49833* (2015.01); *Y10T 29/49904* (2015.01)

(58) Field of Classification Search
CPC ........ H05K 5/04; H05K 7/1418; H05K 7/1425; H05K 7/1427; Y10T 29/49833; Y10T 29/49904
(Continued)

(56) References Cited

U.S. PATENT DOCUMENTS 2,265,725 A * 12/1941 Frederick ............. B23K 11/002
                                                       219/93
3,231,785 A *  1/1966 Calabro ................ H05K 7/1418
                                                       174/16.1
(Continued)

FOREIGN PATENT DOCUMENTS

DE         8912509 U1    12/1989
DE         4215041 A1    11/1992
(Continued)

OTHER PUBLICATIONS

Notification of Transmittal of Translation of the International Preliminary Report on Patentability; International Preliminary Report on Patentability; Written Opinion of the International Searching Authority for corresponding International Application No. PCT/EP2011/063367, dated Feb. 26, 2013, 17 pages.
(Continued)

*Primary Examiner* — Erin B Saad
*Assistant Examiner* — Carlos J Gamino
(74) *Attorney, Agent, or Firm* — Ditthavong & Steiner, P.C.

(57) ABSTRACT

A box-frame housing for the installation of electronic modules has frame elements and side walls and provides a subdivision into sub-regions, which are limited by dividing walls. The frame elements and the side walls and the dividing walls provide at least one recess and/or at least one edge projection. A projection engages in a recess and both are connected to one another by welding.

3 Claims, 9 Drawing Sheets

(58) Field of Classification Search
USPC .......... 361/756; 174/50, 559, 560, 561, 562
See application file for complete search history.

(56) References Cited

U.S. PATENT DOCUMENTS

| | | | | |
|---|---|---|---|---|
| 4,074,495 | A | * | 2/1978 | Bodnar .................. B21D 13/08 |
| | | | | 428/603 |
| 4,232,356 | A | * | 11/1980 | Saunders ............. H05K 7/1425 |
| | | | | 174/DIG. 9 |
| 4,322,776 | A | * | 3/1982 | Job ...................... H05K 7/1418 |
| | | | | 165/185 |
| 4,390,101 | A | * | 6/1983 | Humphreys ......... H05K 7/1418 |
| | | | | 211/41.17 |
| 4,779,744 | A | * | 10/1988 | Shely ................... H05K 7/1418 |
| | | | | 211/41.17 |
| 4,901,205 | A | | 2/1990 | Landis et al. |
| 5,001,816 | A | * | 3/1991 | Oetiker ..................... F16B 2/08 |
| | | | | 24/20 CW |
| 5,185,908 | A | * | 2/1993 | Oetiker .................. B23K 26/22 |
| | | | | 24/20 CW |
| 5,311,397 | A | | 5/1994 | Harshberger et al. |
| 5,398,833 | A | | 3/1995 | Klauss et al. |
| 5,467,254 | A | * | 11/1995 | Brusati ................ H05K 7/1409 |
| | | | | 174/355 |
| 5,805,429 | A | * | 9/1998 | Andersson ........... H05K 7/1418 |
| | | | | 174/359 |
| 6,442,035 | B1 | | 8/2002 | Perry et al. |
| 6,780,043 | B2 | * | 8/2004 | Malmberg ........... H05K 7/1418 |
| | | | | 361/756 |
| 6,908,338 | B2 | | 6/2005 | Okamoto |
| 7,112,740 | B2 | | 9/2006 | Van Haaster |
| 7,320,615 | B2 | * | 1/2008 | Fang .................... H05K 7/1418 |
| | | | | 439/377 |
| 7,483,264 | B2 | | 1/2009 | Chen et al. |
| 9,167,713 | B2 | * | 10/2015 | Muhr ........................ H05K 5/04 |
| 2004/0246693 | A1 | * | 12/2004 | Lloyd ............. H01R 13/65802 |
| | | | | 361/800 |
| 2005/0208831 | A1 | | 9/2005 | Lee |
| 2006/0102575 | A1 | | 5/2006 | Mattlin et al. |
| 2009/0034189 | A1 | * | 2/2009 | Springer ................ G06F 1/185 |
| | | | | 361/690 |
| 2016/0295751 | A1 | * | 10/2016 | Miklinski ............ G02B 6/4261 |

FOREIGN PATENT DOCUMENTS

| | | | |
|---|---|---|---|
| DE | 4215182 | A1 | 11/1993 |
| DE | 9420291 | U1 | 10/1995 |
| DE | 29618628 | U1 | 12/1996 |
| DE | 19545448 | A1 | 6/1997 |
| DE | 19603368 | A1 | 8/1997 |
| DE | 29715114 | U1 | 10/1997 |
| DE | 29707047 | U1 | 5/1998 |
| DE | 19750928 | A1 | 5/1999 |
| DE | 19834463 | A1 | 2/2000 |
| DE | 19942949 | C1 | 8/2001 |
| EP | 1463399 | A1 | 9/2004 |
| EP | 1765049 | A2 | 3/2007 |
| GB | 867961 | A * | 5/1961 ............... B23K 9/23 |

OTHER PUBLICATIONS

International Search Report for corresponding International Application No. PCT/EP2011/063367, dated Mar. 15, 2012.

* cited by examiner

BOX-FRAME HOUSING AND A METHOD OF MANUFACTURE

CROSS-REFERENCE TO RELATED APPLICATIONS

The present application is a division of U.S. application Ser. No. 13/817,991, filed on Feb. 20, 2013, which is a national phase application of PCT Application No. PCT/EP2011/063367, filed on Aug. 3, 2011, and claims priority to German Application No. DE 10 2010 035 100.8, filed on Aug. 23, 2010, and German Application No. DE 10 2010 049 605.7, filed on Oct. 26, 2010, the entire contents of which are herein incorporated by reference.

BACKGROUND OF THE INVENTION

Field of the Invention

The invention relates to a box-frame housing for the installation of electronic modules with a subdivision into sub-regions and a method for its manufacture.

Discussion of the Background

Document DE 196 03 368 A1 describes a box-frame housing for electronic measuring devices of a design conventional at the time. The box-frame housing described comprises an enclosed rectangular frame, a rack-shelf mount with a flat base and narrow side walls projecting at right angles from it, which accommodate the operating elements of the device, and a front cover, which is fitted over the rack-shelf mount and forms the front of the box-frame housing. A module carrier, which is made from sheet metal parts to form a box open on at least one side and in which the individual modules are inserted, is attached to the frame at the rear. A tubular housing, which is open at the front and the rear and is manufactured from sheet metal by bending, can be fitted to the module carrier from the rear. For high-frequency shielding, an all-round annular groove, into which a woven metal thread can be inserted, is formed on a contact web.

The disadvantage with the box-frame housing described is the considerable space required to withdraw the tubular housing, and accordingly, the poor accessibility, especially when the housing is already installed in a rack. A housing mounted on telescopic rails, for example, must be released from the telescopic rails in order to withdraw the tubular housing. Electronic modules are therefore generally installed from the rear of the device in the direction towards the front panel in order to avoid this awkward opening of the housing when modules are replaced. Moreover, it would be desirable to form sub-regions within the housing, which are limited by dividing walls, and, in this manner to group modules of a different type separately.

SUMMARY OF THE INVENTION

Embodiments of the present invention advantageously provide a housing for electronic modules with various subdivisions into sub-regions, which can be manufactured in a simple and cost favorable manner, and which is readily accessible for fitting and maintenance, and a corresponding manufacturing method.

Embodiments of the box-frame housing for the installation of electronic modules comprise frame elements and side walls and provides a subdivision into sub-regions which are limited by dividing walls, wherein the frame elements and the side walls and dividing walls provide at least one recess and/or at least one edge projection; a projection engages in a recess; and the projection and the recess are connected to one another by welding. An extremely diverse range of subdivisions of the box-frame housing can be advantageously achieved through the positioning of the recesses and the corresponding edge projections. The individual side walls and dividing walls can be plugged together simply and form a stable structure even before the welding process. This simplifies the clamping of the individual parts in preparation for the subsequent welding process. This achieves a short pre-clamping time and accordingly an optimized assembly time.

An intermediate space between the projection and an edge of the recess into which the projection engages advantageously provides a width of less than 100 µm, preferably less than 50 µm. The resulting tolerances for the size of the projection and the recesses can be achieved without difficulty with currently conventional punching or laser-cutting technology. Accordingly, conventional punching or cutting techniques can be used for the manufacture of the box-frame housing and allow a cost-favorable manufacture.

The top panel and the base panel are advantageously attached in a detachable manner by inserting into retaining openings in the side walls. The side wall and/or dividing wall provides a front flange with a first and second arm inclined relative to one another, wherein the first arm provides retaining openings for the top panel or respectively base panel. Accordingly, the top panel and base panel can be removed separately from the box-frame housing, upwards or downwards. In this context, the housing can remain in a rack, for example, fitted to telescopic rails. Moreover, no tools, such as screwdrivers etc, are necessary to release the top panel or base panel, so that only a limited free space is required for opening the box-frame housing.

It is also advantageous that a side wall and/or a dividing wall provides a plurality of guide openings with projecting collars, wherein the guide openings are arranged in the side wall or dividing wall in two parallel straight lines at a distance from one another, parallel to the insertion direction of an electronic module. Accordingly, electronic modules can be guided along the projecting collars towards their plugging position. Additionally, the guide openings also guarantee good ventilation of the module disposed behind a dividing wall, and accordingly a continuous air stream through the various sub-regions of the housing.

The collar of a guide opening advantageously provides a rounded contour. This allows easy and damage-free insertion of a module, especially of the printed-circuit board of a module.

At least one spring element is advantageously connected in a detachable manner to a side wall and/or dividing wall and arranged in such a manner that it hooks into the region limited by the spaced guide openings. In particular, the spring element is inserted into a recess of the side wall and/or dividing wall. Accordingly, the position of the spring element can be adjusted in a variable manner within the region limited by the spaced guide openings, and a module, or respectively the printed-circuit board contained therein, can be held at such a height that the terminal of the module is introduced accurately into the plug-connection provided for it. Accordingly, the spacing distance between the region limited by the guide openings can be further selected so that modules with different thicknesses of printed-circuit board can be inserted, and the plug-connection still meets accurately when inserting the module. Accordingly, the plug and the module are subjected to minimal mechanical stress, and the operating life of the module is positively influenced.

At least one centering lug, with which a recess in a module housing engages, is advantageously arranged in the edge region of the side wall and/or dividing wall. Accordingly, an orientation of the module is achieved at the side of the module disposed opposite to the plug, and a movement play of the module is minimised.

It is also advantageous to install a first module or several first modules in a first sub-region of the box-frame housing perpendicular to the plane of the side wall, and to install a second module or several second modules in a second sub-region perpendicular to the side wall and perpendicular to the first module in the first sub-region. This allows a grouping of similar module types, for example, high-frequency modules or digital circuit modules, within one sub-region of the housing. Measures for electromagnetic shielding or for the connection of data links can thus be matched effectively to the requirements of the module type within a sub-region. In this manner, dividing walls can be attached in a targeted manner relative to one another for the electromagnetic shielding of the module types. In most cases, this is adequate, especially, for example, if each high-frequency module is already surrounded by a high-frequency shielded chassis.

Moreover, it is advantageous if a first module or several first modules are plugged into a first base-computer module, the one second module or several second modules are plugged into a second base-computer module and the first base-computer module is arranged parallel to the plugging direction of the second module, and the second base-computer module is arranged parallel to the plugging direction of the first module. Furthermore, it is advantageous that the first base-computer module and the second base-computer module are connected to one another by a plug connection.

This arrangement of the base-computer modules and the modules plugged into them provides free spaces between the modules disposed respectively perpendicular to the side wall and therefore allows effective ventilation with a continuous air stream from one side wall through the intermediate spaces between modules and to the other side wall. Only plug-connections are used for contacting the modules with the respective base-computer module and between the first and the second base-computer module, so that the intermediate spaces between the modules are not filled with cables and do not obstruct the air stream. Moreover, the plug connection between the two base-computer modules forms a space-saving and effective connection.

With the method according to the invention for manufacturing a box-frame housing with frame elements and side walls, which is subdivided into sub-regions, which are limited by dividing walls, at least one recess and/or at least one edge projection is introduced into the side walls and dividing walls. The side walls and dividing walls are connected together through the engagement of a projection in a recess, and the projection and the recess are connected to one another by welding.

It is particularly advantageous if the side walls and dividing walls provide one or more ventilation zones, in each case with a plurality of ventilation openings, and a transverse embossing is introduced into the side wall and/or dividing wall in the region of the ventilation zone, transversely to one edge of the side wall and/or dividing wall. This prevents a bending or bulging of the side wall by punching out the ventilation openings and promotes the stability of the box-frame housing.

It is also advantageous if all recesses, projections, retaining openings, guide openings and ventilation openings are introduced by means of punching and the guide projections by means of embossing. Accordingly, all guide openings and attachment openings can be manufactured in one or respectively two operating runs. This allows a short manufacturing time using current manufacturing technology and is therefore cost favorable. Different box-frame housing variants can be manufactured simply by changing the positioning of the recesses and edge projections.

BRIEF DESCRIPTION OF THE DRAWINGS

Exemplary embodiments of the box-frame housing according to the invention are illustrated by way of example in the drawings and explained in greater detail on the basis of the subsequent description. The drawings are as follows.

DETAILED DESCRIPTION OF EXEMPLARY EMBODIMENTS OF THE INVENTION

Parts corresponding to one another are provided with the same reference numbers in all of the drawings.

Figure 1:
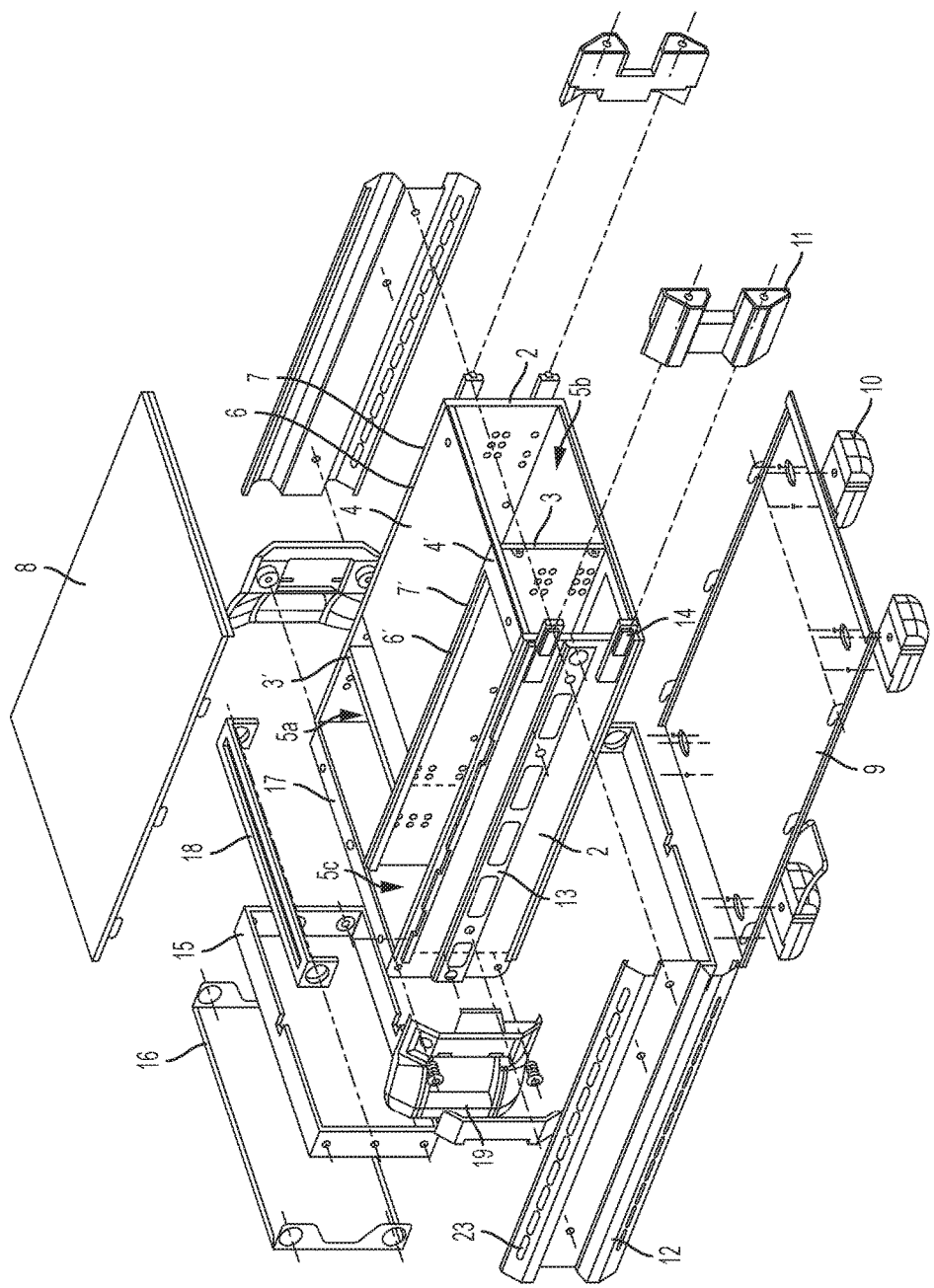
FIG. 1 shows an exemplary embodiment of a box-frame housing according to the invention in an exploded view.

FIG. 1 shows an overview of the components of a box-frame housing 1 according to the invention. The base element of the housing provides two side walls 2, one or more dividing walls 3 and frame elements 4, which can be punched out as flat frame elements 4 or stepped frame elements 4' or also as front frame elements 17. Different sub-regions 5a, 5b, 5c in the box-frame housing are formed either by the dividing walls 3 aligned parallel to the side wall 2 and/or by the dividing wall 3' aligned perpendicular to the side walls 2. The side walls and dividing walls, the frame elements, a top panel and a base panel 8, 9 are manufactured from a metal sheet, preferably a stainless steel sheet.

The top panel 8 and the base panel 9 enclose the basic housing element. The structural elements inserted into the sub-regions are additionally electromagnetically shielded by a metallic connection between this top panel and base panel 8, 9 and between the side walls or respectively dividing walls. The housing itself must only provide a given electromagnetic shielding function, because the individual modules themselves are implemented in electromagnetically shielded chassis.

Adjoining the front frame element 17, a rack-shelf mount 15 and a front panel 16 is fitted via a locking rail 18. The surface of each of the two side walls 2 facing outwards provides an attachment rail 13, on which a side casing 12 and, optionally adjoining the latter, lateral handles or telescopic rails are fitted. The side casing provides ventilation openings 19, in order to allow an inlet and outlet of air into the housing for cooling purposes. Front carrying handles 19 can be attached to the side casing 12 and/or to the front frame element 17.

At the rear end of the side walls 2, a further mounting element 14 is provided, to which for example a rear wall foot 11 is attached, which serves as impact protection and as a spacer for the assembly of terminals and plugs. A device not fitted in a rack can also be positioned on these rear wall feet 11. Additionally, standing feet 10 can be fitted to the base panel 9 of the box-frame housing in order to install the measuring device in a rack, for example, on a shelf base. The feet 9 or respectively 11 must be removed in order to open the housing.

Figure 2:
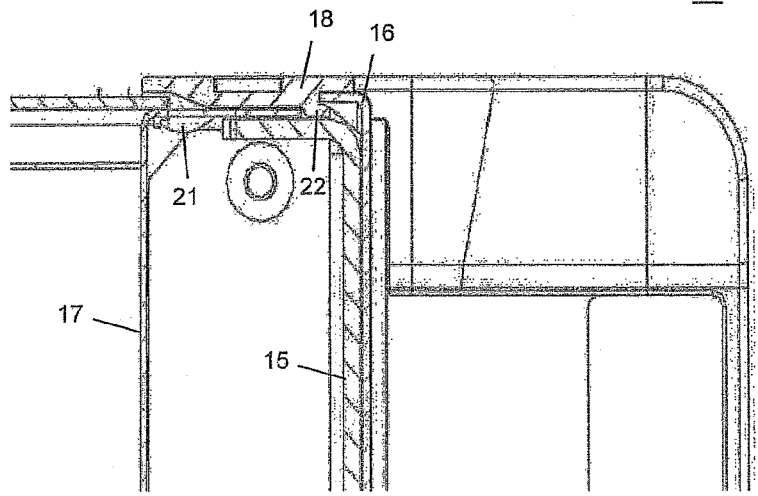
FIG. 2 shows an exemplary embodiment of a front cover of a box-frame housing according to the invention in a lateral view.

FIG. 2 shows an enlarged view of a front cover 20 comprising the front panel 16 and the rack-shelf mount 15. This front cover 20 is connected to the front frame element 17 via a locking rail 18. For this purpose, the front panel 16 is connected to the rack-shelf mount 15 by a front locking element 22 of the locking rail 18. The front cover 20 is connected to the front frame element 17 via a housing locking element 21, which engages with its lug under the front frame element 17. The front carrying handle 19, which is used for withdrawing the measuring device from a rack, projects laterally from the front cover 20.

Figure 3:
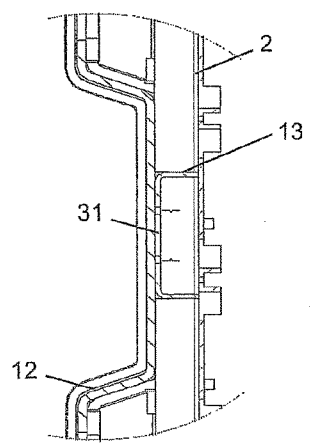
FIG. 3 shows an exemplary embodiment of a side element of a box-frame housing according to the invention.

FIG. 3 shows a side element of the box-frame housing comprising a side wall 2, a fastening rail 13 and a side casing 12 fitted to the latter. The fastening rail 13 is preferably also made from a stainless steel sheet and provides larger recesses 31 in order to save weight. The fastening rail 13 stabilizes the box-frame housing 1 and serves as a fastening base for the side casing 12 and other components such as the carrying handle or telescopic rails.

Figure 4:
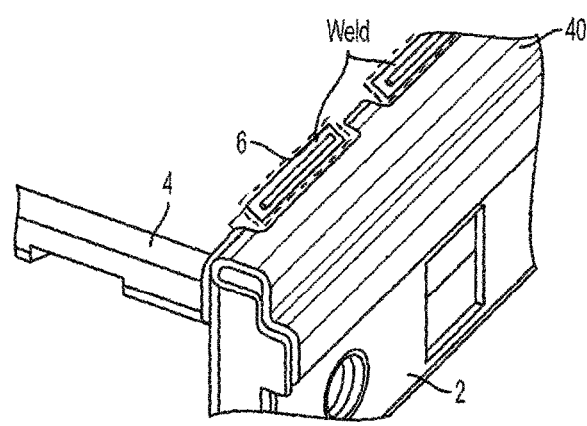
FIG. 4 shows an exemplary embodiment of a connection according to the invention between side walls and/or dividing walls with a frame element in a perspective view.

FIG. 4 shows an enlarged detail of the connection between a top frame element 4 and a side wall 2. The frame element 4, which is preferably manufactured from stainless steel sheet, provides at least one recess 7 in the edge region. Correspondingly, at least one projection 6 is provided in the edge region of the side wall 2 in a terminal element 40, which is fitted together to form a plug connection and connected to the recess 7 in a material-fit manner by welding.

Figure 5:
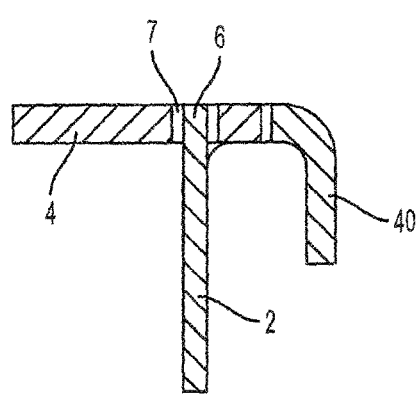
FIG. 5 shows an enlarged view of a connection according to an exemplary embodiment of the invention between a side wall and/or dividing wall and a frame element corresponding to FIG. 4 in a lateral view.
Figure 6:
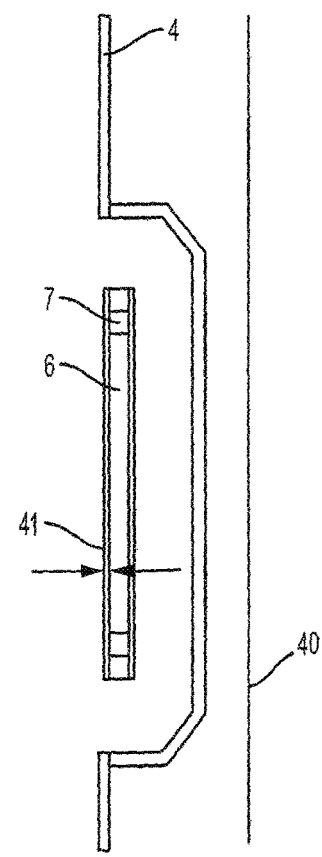
FIG. 6 shows a connection according to an exemplary embodiment of the invention corresponding to FIG. 5 in a plan view.

In FIGS. 5 and 6, this plug connection is illustrated in an enlarged lateral view and plan view. The side wall 2 provides a projection 6 at regular intervals, which projects above the height of the side wall 2 corresponding to the thickness of the frame element 4. The projection 6 engages in a recess 7 of the top frame element 4.

As shown clearly in FIG. 6, only a narrow intermediate space 41 remains between the recess 7 and the projection 6. By preference, the recesses are manufactured by punching or laser cutting, so that the intermediate space 41 measures less than 100 μm, preferably less than 50 μm in width. The side walls and dividing walls 2, 3 and the frame elements 4, 4', 17 can thus already be connected to one another in a stable manner by plug connection, so that only minor clamping measures are now required for the subsequent welding process. As a result of the narrow intermediate space 41, the material of the projection connects very rapidly with the adjacent material of the frame element, so that the welding process can be implemented rapidly and with low energy.

Figure 7:
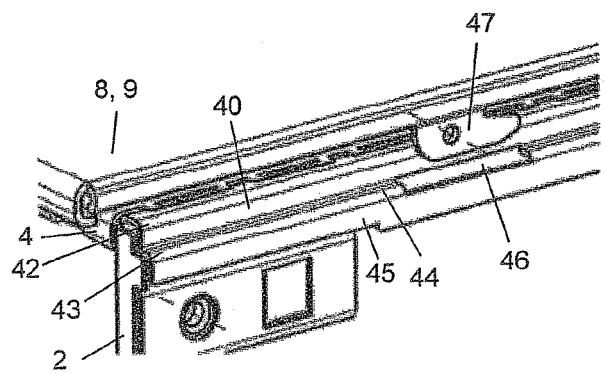
FIG. 7 shows an exemplary embodiment of the connection between top panel and side wall of a box-frame housing according to the invention in a perspective view.

FIG. 7 illustrates the connection between a side wall 2 and a flat frame element 4 and especially to the top panel or base panel 8, 9 disposed above it. As already shown in FIG. 4, the side wall 2 provides a terminal element 40, which is embodied to form a first and second front flange 42, 43. Each front flange 42, 43 provides a first arm 44 and a second arm 45, which is curved through 90° relative to the arm 44. In order to detach the top panel or base panel 8, 9 from the housing with a minimum space requirement, the top panel or base panel 8, 9 provides several hooks 47 projecting perpendicularly from the top panel or base panel 8, 9 distributed over its length at the edge, which are inserted into retaining openings 46 in the first arm 44 of the second front flange 43. The hook extending diagonally away from the top panel or base panel 8, 9 ensures a pre-clamping during the insertion between the hook 47 and the first arm 44 of the terminal element, so that the top panel is not only fixed in an anti-slip manner but also guarantees a good electrical contact between the side wall 2 and the top panel or base panel 8, 9.

Figure 8:
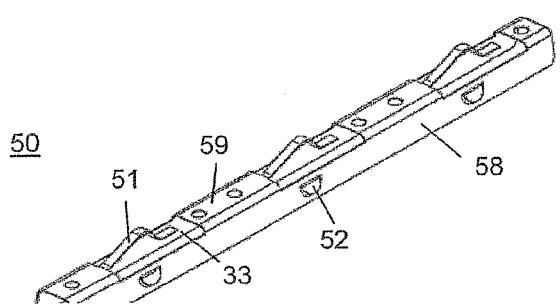
FIG. 8 shows a first exemplary embodiment of a first spring strip of a box-frame housing according to the invention in a perspective view.
Figure 9:
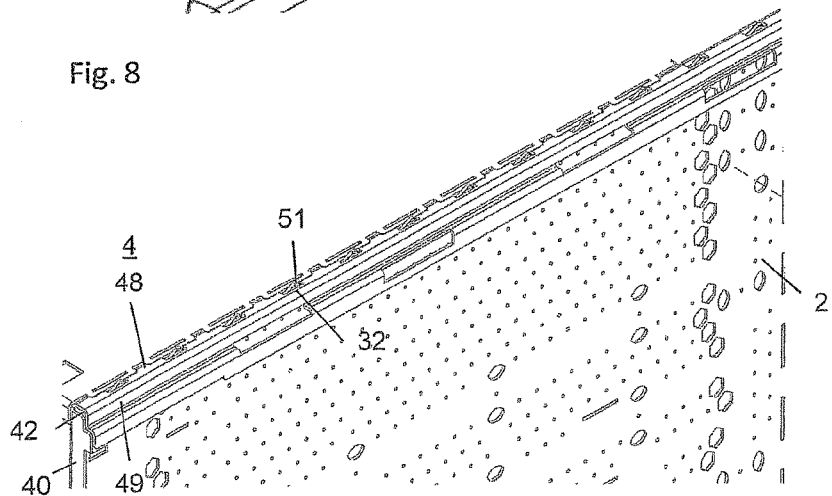
FIG. 9 shows an exemplary embodiment of a side wall with spring strip corresponding to FIG. 8 of a box-frame housing according to the invention.

In order further to improve the electrical contact between the side wall or dividing wall 2, 3 and top panel or base panel 8, 9, a first exemplary embodiment of a spring strip 50, see FIG. 8, can be introduced into the first front flange 42 of the terminal element 40 of the side wall or dividing wall 2, 3, as illustrated in FIG. 9. For this purpose, the first arm 48 of the first front flange 42 provides recesses 32, through which the spring tongues 51 of the spring strip 50 inserted from below into the first front flange 42 penetrate and produce an electrical contact with the top panel or base panel 8, 9.

The spring strip 50 illustrated separately in FIG. 8 is preferably manufactured from a sheet-metal part and provides spring tongues 51 on a front face 59, which is disposed between lateral arms 58 curving downwards. The spring tongues 51 are also narrow curved metal strips, which are attached to the front face 59 of the spring strip 50 and project into recesses 33 in the front face 59. The spring strip 50 is secured against slipping by holding elements 52, which are formed, for example, by cutting a semicircular curve into the lateral arms 58 of the spring strip 50 and bending the cut-out region upwards into recesses, which are not illustrated, in the second step 49 of the first front flange 42 of the side wall or dividing wall 2, 3.

Figure 10:
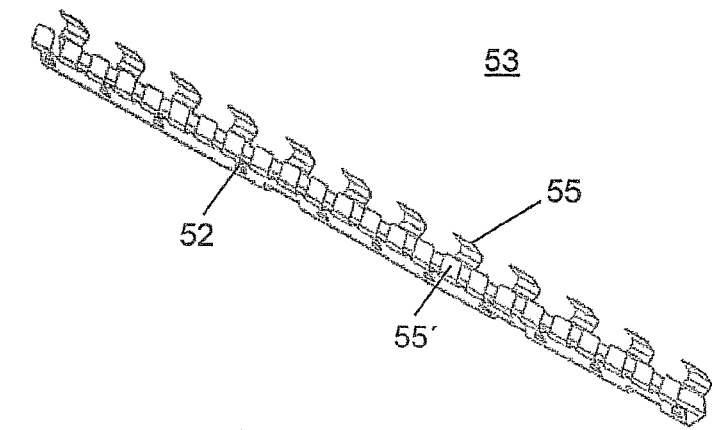
FIG. 10 shows a second exemplary embodiment of a spring strip according to the invention in a perspective view.

FIG. 10 shows a further exemplary embodiment of a spring strip 53, which is manufactured in a similar manner to the spring strip 50, preferably by punching and bending. This spring strip 53 is preferably inserted between the top panel and base panel 8, 9 and the rear frame element 4', 4. The spring strip 53 is also fixed in a flange of the frame element 4' or 4 via holding elements 52. In this context, the spring elements 55 project in the direction towards the top panel or base panel 8, 9 through recesses in the frame element 4, 4', above the latter and form an electrical contact with the top panel or base panel 8, 9. The spring elements 55' projecting into the interior of the box-frame housing establish electrical contact with inserted modules or with their rear wall.

Figure 11:
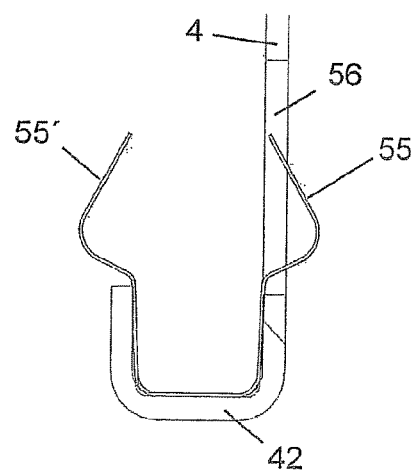
FIG. 11 shows the second exemplary embodiment of a spring strip according to the invention installed in a frame element in a lateral view.

FIG. 11 shows the spring strip 53 installed in a front flange 42 of the frame element 4. The spring element 55 passes through the recess 56 of the frame element 4, whereas the spring element 55' faces towards the opposite side.

Figure 12:
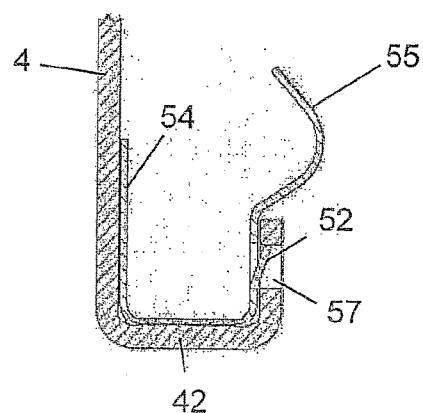
FIG. 12 shows a third exemplary embodiment of a spring strip according to the invention installed in a frame element in a lateral view.

FIG. 12 shows a third exemplary embodiment of a spring strip 54 with a spring element 55 projecting only on one side. This is inserted into a front flange 42 of a frame element 4 in the same manner as the spring strip 53 in FIG. 11, and is held within the recess 57 by the holding element 52. The holding element 52 is locked in the recess 57 and therefore prevents slipping from the flange. As a result of the width of the holding element 52 and the width of the recess 57, only a slight displacement in the longitudinal direction of the spring strip 54 is possible.

Figure 13:
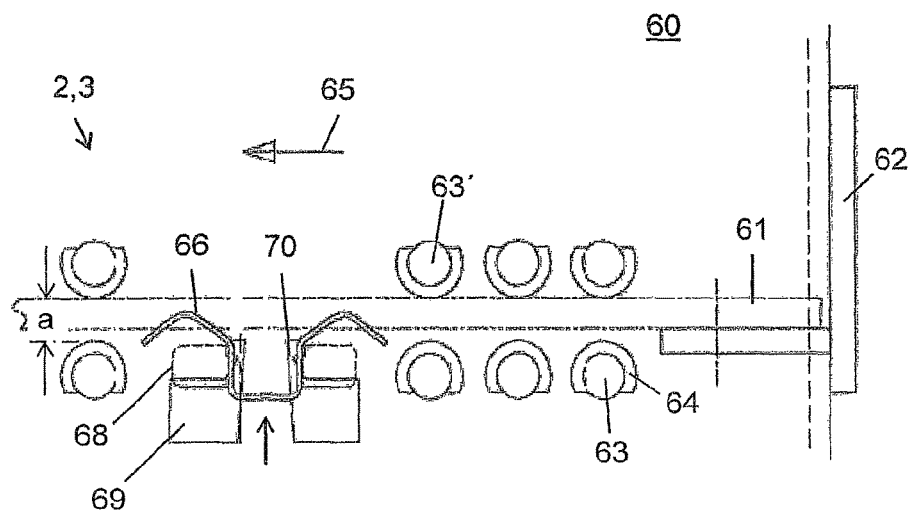
FIG. 13 shows an exemplary embodiment of a guide arrangement for modules of a box-frame housing according to the invention in a lateral view.
Figure 14:
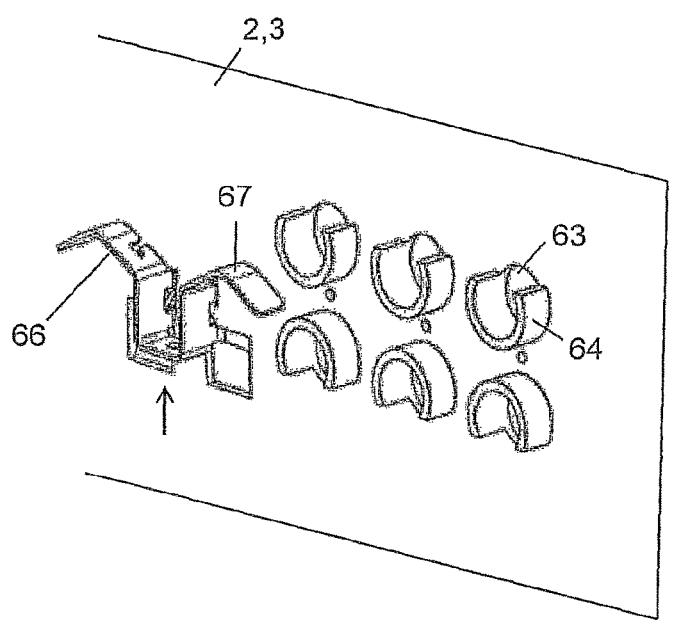
FIG. 14 shows a module guide arrangement corresponding to FIG. 13 in a perspective view.

FIG. 13 and FIG. 14 shows a guide arrangement 60 for the positioning of modules in the sub-regions of the box-frame housing. The view of a side wall or dividing wall 2, 3 shows guide openings 63 which provide a collar 64. The guide openings 63 are arranged parallel to one another in two rows, wherein the collars 64 face towards one another. The spacing distance a shown in FIG. 13 on the left in this drawing is dimensioned so that printed-circuit boards 61 of different thickness can be inserted between the collars. As a result of the rounded shape, here, for example, circular segments, of the collars 64, the printed-circuit board 61 of a module can be inserted easily and without damage in the insertion direction 65. The printed-circuit board 61 itself is fitted to a rear wall 62 of a module here. In order to guarantee a firm seating of the printed-circuit board 61 between the guide openings, one or several springs 67 can be readily inserted into retaining openings 69 below the guide opening 63. The retaining opening 69 provides a lateral throat alongside a large-area region, which additionally provides a narrowing 70. Holding tabs 68, which project laterally from the spring, are inserted into the retaining openings 69 and pushed in the direction towards the printed-circuit board 61, see arrow. A slipping back of the spring 67 is prevented by the narrowing 70 in the retaining opening 69. This can be removed from the side wall or dividing wall 2, 3 again simply by pressing together the spring 67.

The spring 67 exerts a slight pressure on the printed-circuit board and holds the latter firmly in the guide openings 63' disposed opposite. Accordingly, the printed-circuit board 61 no longer has any movement play, or respectively, in the case of a powerful impact, its movement can be cushioned.

The spring 67 can be fitted on the side wall or dividing wall 2, 3 even before the insertion of the printed-circuit board. When inserting the printed-circuit board 61 in the insertion direction 65, the spring element 66 curving downwards is pressed down and allows the printed-circuit board 61 to pass. The arrow in FIG. 14 shows the installation direction of the spring 66 on the side wall or dividing wall 2, 3. The guide opening 63 here is illustrated with a collar 64 of consistent height over the entire peripheral length. However, the collar 64 can also taper downwards at the side facing away from the printed-circuit board 61. The collar 64 is preferably manufactured by punching and/or bending of the side wall or dividing wall 2, 3.

Figure 15:
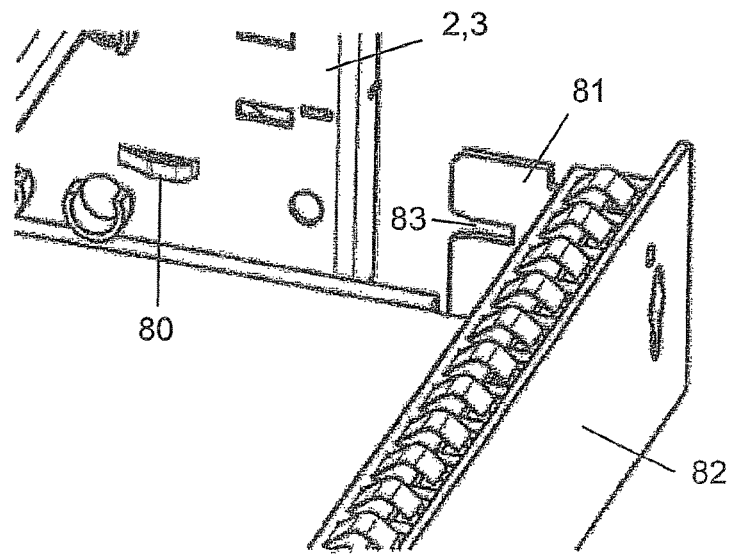
FIG. 15 shows a first exemplary embodiment of a centering device of the box-frame housing according to the invention in a perspective view.

FIG. 15 shows a centering lug 80 in a side wall or dividing wall 2, 3. The centering lug 80 is arranged in the side wall or dividing wall 2, 3 at a slight distance from the rear side, and manufactured by punching and bending of the side wall or dividing wall 2, 3. A side plate 81 projecting from the rear wall 82 of a module provides a centering slot 83, which encloses the centering lug 80 when the module is inserted. Fixing the height of the module in this manner ensures that a plug at the front of the module is disposed at a height matching the counter-plug part.

Figure 16:
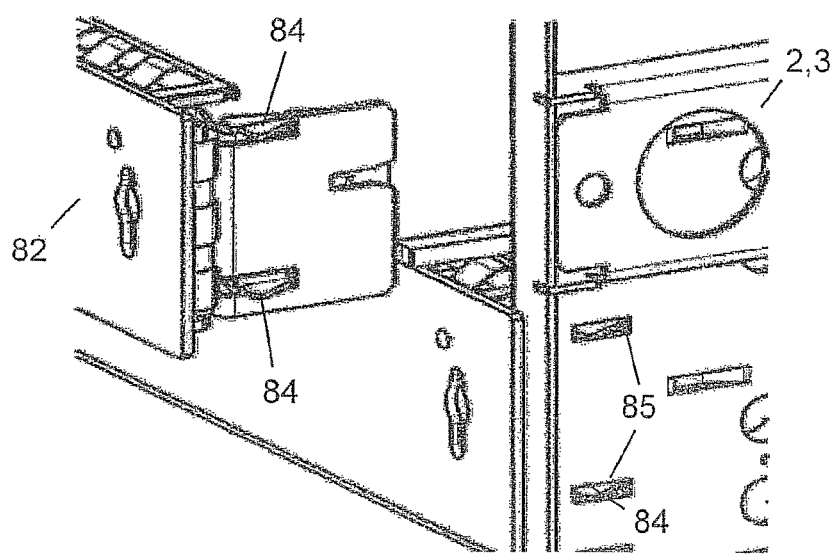
FIG. 16 shows a second exemplary embodiment of a centering device of the box-frame housing according to the invention in a perspective view.

FIG. 16 shows a further centering arrangement, which also serves to lock a module in the housing. In this arrangement, two locking lugs 84 are attached in a spring-loaded manner to the upper and lower edge of the side plate 81 of the rear wall 82 of a module. When the rear wall 82 of the module is inserted, these locking lugs 84 engage in the corresponding recesses 85 in the side wall or dividing wall 2, 3. Since the locking lugs 85 do not spring back in the direction against the insertion direction, the module can only be released from the box-frame housing 1 with the use of tools.

Figure 17:
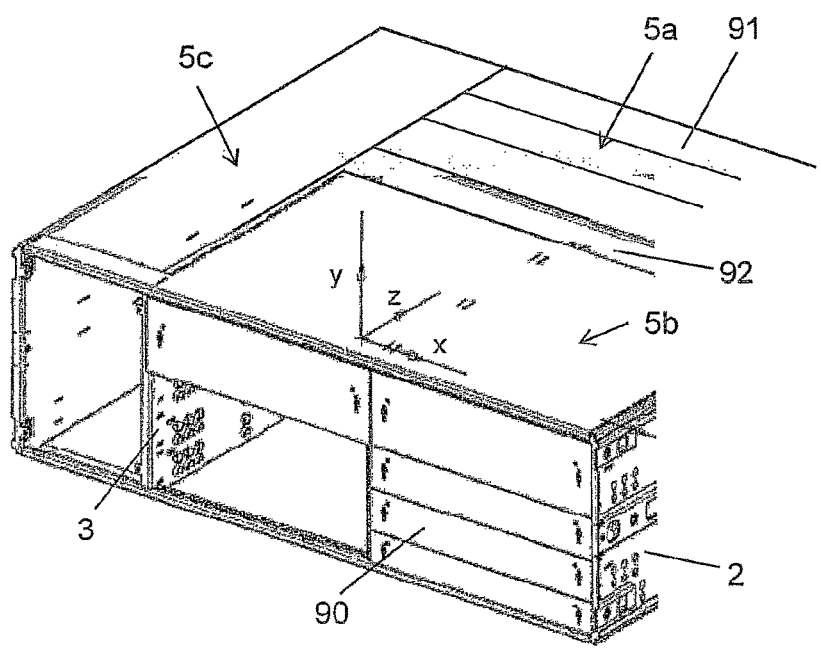
FIG. 17 shows an exemplary embodiment of a module arrangement in the box-frame housing according to the invention in a perspective view.

FIG. 17 illustrates a box-frame housing 1 with sub-regions 5a, 5b, 5c. In the sub-region 5b, several first modules 90 are inserted in the z-direction. A first base-computer module, which is orientated in the y-direction, is disposed in the region 92. The first modules 90 are connected to the first base-computer module by plugs. In the sub-region 5a, plug positions for two modules 91 are illustrated, which are also inserted in the y-direction and connected via plugs to a second base-computer module, which is not illustrated, but which is arranged in the z-direction on the base of the sub-region. The two base-computer modules are preferably also connected to one another by plugs.

As a result of this insertion direction of the first and respectively second module 90, 91, an air stream can pass in the x-direction both between the first modules 90 and also the second modules 91. The side walls 2 and dividing walls 3 orientated in the y-direction provide a plurality of openings, such as the guide openings 63, but also dedicated ventilation openings, so that air can flow in and out in the x-direction. This arrangement thus allows effective ventilation of the first and second module and of their associated base-computer modules.

If the box-frame housing is used, for example, for a high-frequency measuring device, digital modules can be accommodated as the first modules 90 in sub-region 5b, and analog circuits for the high-frequency generation or analysis can be accommodated as second modules 91 in sub-region 5a. The power supply module of the device can be disposed in sub-region 5c of the box-frame housing 1.

Figure 18:
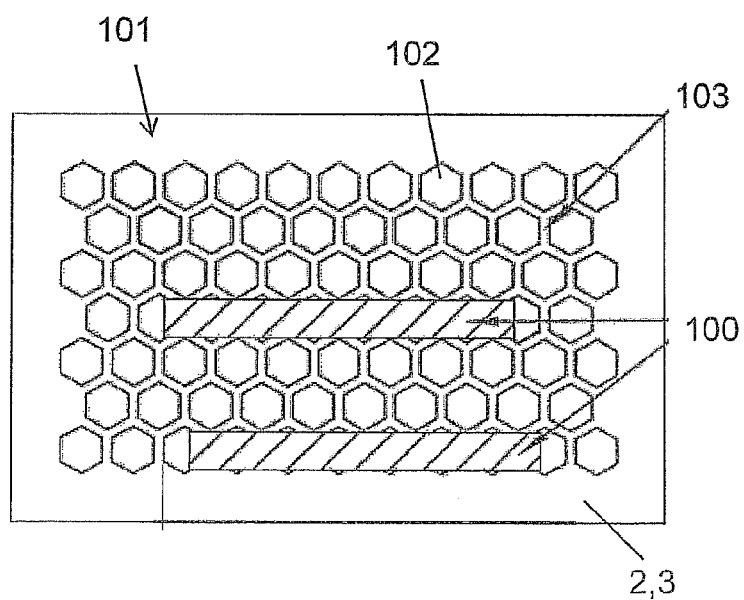
FIG. 18 shows an exemplary embodiment of a side wall or dividing wall with ventilation zone with embossing die in a plan view.

FIG. 18 shows a ventilation zone 101 of a side wall or dividing wall 2, 3. A plurality of ventilation openings 102 are arranged close together and only separated from one another by a narrow web 103. The ventilation openings 102, like most of the previously described openings or recesses, are formed by punching of the stainless steel sheet. In order to avoid bulging of the side wall or dividing wall 2, 3, a transverse embossing, that is, perpendicular to the plane of the side wall or dividing wall, is introduced into the latter. For this purpose, an embossing die 100, which preferably provides 8 ventilation openings 102, is applied to a sub-region of the ventilation zone 101. This transverse embossing is preferably approximately 0.4 mm deep and is repeated preferably in every fourth row of the ventilation openings 102.

All of the features described and/or characterized can be advantageously combined with one another within the scope of the invention. The invention is not restricted to the illustrated exemplary embodiments.

The invention claimed is:

1. A method for manufacturing a box-frame housing for installation of electronic modules, said method comprising:
    forming a box-frame housing that provides frame elements and side walls, and also provides a division into sub-regions, wherein the sub-regions are limited by dividing walls,
        wherein the frame elements, the side walls and the dividing walls are fitted together so that a projection engages respectively in a recess, and the projection and the recess are connected to each other by welding,
        wherein guide openings with projecting collars are arranged in the side walls or the dividing walls in two parallel straight lines at a distance from one another, and parallel to an insertion direction of an electronic module,
        wherein the projecting collars face towards one another,
        wherein a spring holds a printed circuit board in the guide openings,
        wherein the spring is connected in a detachable manner to one of the side walls or the dividing walls so that the spring hooks into a region limited by the guide openings which are spaced at the distance from one another, and
        wherein holding tabs are inserted into retaining openings to adjust the spring in a variable manner.

2. The method according to claim 1,
    wherein one or more ventilation zones, with a plurality of ventilation openings, are introduced into the side walls or the dividing walls, and a transverse embossing is introduced into the side walls or the dividing walls in a region of the ventilation zones.

3. The method according to claim 2,
    wherein the retaining openings, the guide openings and the ventilation openings are formed by punching; and
    wherein a centering lug is formed by punching and bending.

* * * * *